United States Patent
Kim et al.

(10) Patent No.: US 7,825,041 B2
(45) Date of Patent: Nov. 2, 2010

(54) METHOD OF REWORKING A SEMICONDUCTOR SUBSTRATE AND METHOD OF FORMING A PATTERN OF A SEMICONDUCTOR DEVICE

(75) Inventors: Eun-Sung Kim, Seoul (KR); Tae-Kyu Kim, Ansan-si (KR); Seok-Hwan Oh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 339 days.

(21) Appl. No.: 12/068,410

(22) Filed: Feb. 6, 2008

(65) Prior Publication Data

US 2008/0194097 A1  Aug. 14, 2008

(30) Foreign Application Priority Data

Feb. 8, 2007  (KR)  ....................... 10-2007-0013075

(51) Int. Cl.
*H01L 21/31* (2006.01)
*H01L 21/469* (2006.01)

(52) U.S. Cl. .................. 438/780; 430/329; 430/331; 438/725; 257/E21.492; 257/E21.495

(58) Field of Classification Search .............. 430/329, 430/331; 438/725, 780
See application file for complete search history.

(56) References Cited

U.S. PATENT DOCUMENTS

2007/0117411 A1* 5/2007 Ogihara et al. ............. 438/780

FOREIGN PATENT DOCUMENTS

| JP | 2002-033257 | 1/2002 |
|---|---|---|
| KR | 1989-13708 | 9/1989 |
| KR | 1995-025901 | 9/1995 |
| KR | 10-2004-0030584 A | 4/2004 |
| KR | 10-2004-0067121 A | 7/2004 |
| KR | 10-2005-0020511 A | 3/2005 |
| KR | 10-2005-0063319 A | 6/2005 |
| KR | 10-2005-0078903 A | 8/2005 |

OTHER PUBLICATIONS

Korean Office Action dated Feb. 26, 2008 for Korean counterpart Application No. 2007-13075.

* cited by examiner

*Primary Examiner*—Asok K Sarkar
(74) *Attorney, Agent, or Firm*—Harness, Dickey & Pierce, P.L.C.

(57) ABSTRACT

A method of reworking a semiconductor substrate and a method of forming a pattern of semiconductor device using the same without damage to an organic anti-reflective coating (ARC) is provided. The method of reworking a semiconductor substrate includes forming a photoresist pattern on a substrate having the organic ARC formed thereon. An entire surface of the substrate having the photoresist pattern formed thereon may be exposed when a defect is present in the photoresist pattern. The entire-surface-exposed photoresist pattern may be removed by performing a developing process without damage to the organic ARC.

15 Claims, 4 Drawing Sheets

METHOD OF REWORKING A SEMICONDUCTOR SUBSTRATE AND METHOD OF FORMING A PATTERN OF A SEMICONDUCTOR DEVICE

PRIORITY STATEMENT

This application claims the benefit of priority under 35 U.S.C. §119 to Korean Patent Application No. 2007-0013075, filed on Feb. 8, 2007 in the Korean Intellectual Property Office (KIPO), the disclosure of which is incorporated herein by reference in its entirety.

BACKGROUND

1. Field

Example embodiments relate to a method of reworking a semiconductor substrate. Other example embodiments relate to a method of reworking a semiconductor substrate and a method of forming a pattern of semiconductor device using the same without damage to an organic anti-reflective coating (ARC).

2. Description of the Related Art

Recently, in an attempt to manufacture semiconductor devices having faster operation speeds accompanied by a larger capacity, methods of manufacturing a more reliable semiconductor device having an increased density and/or faster response speed are being developed. In order to increase the density of the semiconductor device, the requirements for microfabrication technologies (e.g., photolithography) are strict.

The photolithography, In order to form fine patterns that are applied to a semiconductor device, photolithography is performed using a photoresist pattern as an etching mask. An anti-reflective coating (ARC) may be formed on an object layer before the photoresist film is formed in order to form the photoresist pattern. The ARC is used to reduce reflections of an etching object layer from light produced during an exposure process when the photoresist is patterned in a photolithography process.

The ARC prevents (or reduces) a standing wave effect generated by interference between a light incident to a photoresist film from the exposure and a light reflecting from the etching object layer. The ARC may prevent (or reduce) unusual reflection in the topography due to patterns formed in a preceding process and diffused reflection at edges.

Prior to forming the photoresist pattern, the precision of a critical dimension (CD) of a fine circuit pattern may be increased by forming the ARC such that the process latitude for manufacturing conditions increases. The ARC having the above-mentioned characteristics may be categorized as an inorganic ARC including inorganic materials and an organic ARC including organic materials. The inorganic ARC has increased adhesion to the topography of lower object layer and may not be easily removed in a subsequent process. The inorganic ARC may not adhere as well as the organic ARC to a formed photoresist pattern. As such, it is more desirable to use the organic ARC than the inorganic ARC.

In a photolithography process using the organic ARC, an organic ARC may be formed by performing a baking process after spin-coating organic ARC materials on an etching object layer. A photoresist pattern may be formed by performing an exposure process using an exposure mask, a baking process and/or a developing process after forming a photoresist film on the organic ARC. Finer patterns may be formed on a semiconductor device by etching the etching object layer exposed by the photoresist pattern.

The above-mentioned photolithography process varies depending on whether a profile of the photoresist pattern is appropriate for an etching mask. A defect may occur in the profile of photoresist pattern due to variables generated during the spin-coating process, baking process, exposure process and/or developing process for form a photoresist film. When fine patterns are formed on a semiconductor device by performing an etching process using the photoresist pattern having the defects, resulting patterns may also have defects. When there is a defect in forming the photoresist pattern, a reworking process may be performed on a semiconductor substrate, in which a photoresist pattern is reformed after the photoresist pattern is removed from the semiconductor substrate.

Removal of the photoresist pattern to rework the semiconductor substrate may be performed using a combination of a dry cleaning process (e.g., an ashing process using oxygen plasma) and a wet cleaning process using organic stripper. When the photoresist pattern is removed by the ashing process using the oxygen plasma, degradation of a semiconductor device may occur due to damage to an exposed surface of the substrate. The ashing process using the oxygen plasma may contribute to the removal of the organic ARC under the photoresist pattern therewith.

SUMMARY

Example embodiments relate to a method of reworking a semiconductor substrate. Other example embodiments relate to a method of reworking a semiconductor substrate and a method of forming a pattern of semiconductor device using the same without damage to an organic anti-reflective coating (ARC).

Example embodiments provide a method of reworking a semiconductor substrate capable of removing a photoresist pattern in which a defect occurs without damage to an organic anti-reflective coating (ARC) by performing an exposure process.

According to example embodiments, there is provided a method of reworking a semiconductor substrate. In the method of reworking the semiconductor substrate, a photoresist pattern may be formed on the substrate having an organic ARC formed thereon. An entire surface of the substrate, which has the photoresist pattern formed thereon, may be exposed when a defect occurs in the photoresist pattern. The exposed surface of the photoresist pattern may be removed by performing a developing treatment, reducing (or preventing) damage to the organic ARC. As such, the substrate without damage to the organic ARC may be provided (or formed).

According to example embodiments, the organic ARC may be formed by baking a preliminary organic ARC at a temperature of about 180° C. and about 230° C. after forming the preliminary organic ARC by spin-coating an organic material to form the organic ARC on the substrate.

The photoresist pattern may be formed by forming a photoresist film on the organic ARC, selectively exposing the photoresist film using an exposure mask and developing the exposed photoresist film using a developing solution.

According to example embodiments, examples of light sources used in the entire-surface exposure may include an ArF light source (ArF laser), a KrF light source (KrF laser), an $F_2$ light source ($F_2$ laser), an Hg—Xe light source (Hg—Xe laser) or the like.

After exposing the entire surface of the substrate, the exposed surface of the photoresist pattern may be baked at a temperature of about 100° C. and about 130° C.

According to example embodiments, there is provided a method of forming a pattern of a semiconductor device. In the method of forming the pattern of the semiconductor device, an organic ARC may be formed on a substrate having an etching object layer formed thereon. A first photoresist pattern may be formed on the organic ARC. An entire surface of the substrate, which has the first photoresist pattern formed thereon, may be exposed when a defect occurs in the first photoresist pattern. The exposed surface of the first photoresist pattern may be baked at a temperature of about 100° C. and about 130° C.

The baked first photoresist pattern may be removed using a developing process without damage to the organic ARC. A second photoresist pattern may be formed on the organic ARC. An object layer pattern may be formed by patterning the etching object layer using the second photoresist pattern as an etching mask. The second photoresist pattern may be removed. As such, a pattern for the semiconductor device may be formed on the substrate.

In above-mentioned method of reworking the semiconductor substrate according to example embodiments, a photoresist pattern having defects may be removed without damage to an organic ARC by exposing the entire surface of the substrate and performing a developing process on the photoresist pattern having the defects. Because an additional process for reforming an organic ARC on the substrate may be unnecessary when a photoresist pattern is subsequently formed on the substrate, the costs and/or time associated with performing the method may decrease.

BRIEF DESCRIPTION OF THE DRAWINGS

Example embodiments will be more clearly understood from the following detailed description taken in conjunction with the accompanying drawings.

FIG. 1 is a flow chart illustrating a method of reworking a semiconductor substrate according to example embodiments; and FIGS. 2 to 7 are diagrams illustrating cross-sectional views of a method of forming a pattern of a semiconductor device using a method of reworking a semiconductor substrate according to example embodiments.

DETAILED DESCRIPTION OF EXAMPLE EMBODIMENTS

Figure 1:
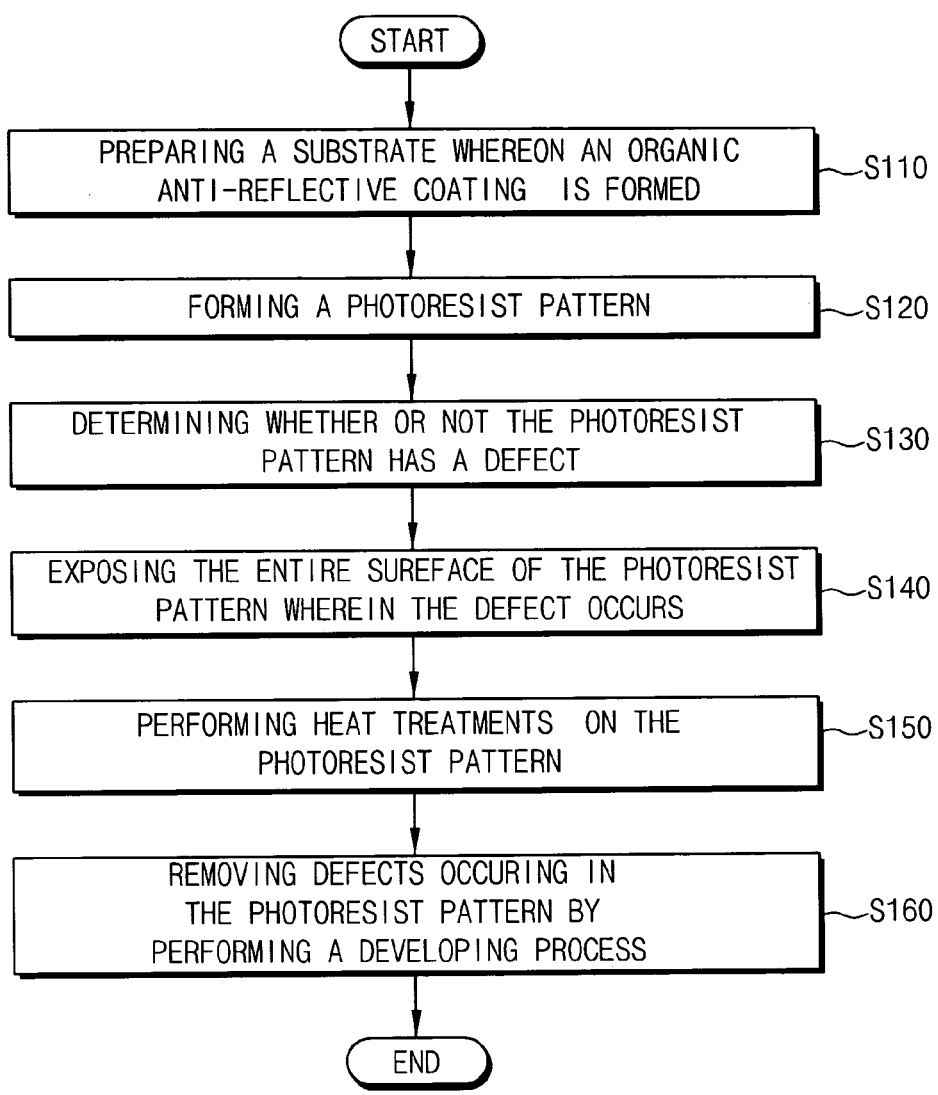
FIGS. 1-4 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, when the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a method of reworking a semiconductor substrate. Other example embodiments relate to a method of reworking a semiconductor substrate and a method of forming a pattern of semiconductor device using the same without damage to an organic anti-reflective coating (ARC).

FIG. 1 is a flow chart illustrating a method of reworking a semiconductor substrate according to example embodiments.

Referring to FIG. 1, a substrate having an organic anti-reflective coating (ARC) may be prepared (or formed) (S110).

Examples of the substrate may include a silicon substrate having an etching object layer or a silicon-on-insulator (SOI) substrate having an etching object layer. Examples of the etching object layer may include a polysilicon layer, a silicon nitride layer, a silicon oxide layer, a metal nitride layer, a metal layer or the like. The etching object layer may have a simple structure or a stacked structure of at least two simple structures.

The organic ARC may include silicon oxynitride (SiON), silicon carbide (SiC) or the like.

The organic ARC may be formed on the substrate to increase adhesion between the etching object layer and a photoresist pattern formed in a subsequent process. The organic ARC may prevent (or reduce) a standing wave effect generated by interference between a light incident to a photoresist film from the exposure and a light reflective from the etching object layer.

The organic ARC may prevent (or reduce) unusual reflection in the topography due to patterns formed in preceding process and diffused reflection at edges.

Spin-coating may be performed on an organic material used to form an organic ARC on the substrate. A preliminary organic ARC may be formed. The organic ARC may be formed by baking the preliminary organic ARC at a temperature of about 180° C. and about 230° C.

A photoresist pattern may be formed on the organic ARC is formed (S120).

The photoresist pattern may be formed by forming a photoresist film. The photoresist film may be exposed using light. The exposed photoresist film may be developed using a developing solution and dried.

A method of forming the photoresist pattern will be explained in detail. Surfaces of the substrate may be cleaned to remove contaminants remaining on the organic anti-reflective coated substrate. A preliminary photoresist film may be formed by coating photoresist compositions on the cleaned substrate. The photoresist compositions may include methacrylate or acrylate, a photoacid generator and/or an organic solvent.

A photoresist film may be formed by performing a first baking process to heat the preliminary photoresist film on the substrate. The first baking process may be performed at a temperature of about 90° C. and about 130° C. Adhesion of the photoresist film to the organic ARC may increase due to the first baking process.

The photoresist film may be selectively exposed. To expose the photoresist film, an exposure mask having a circuit pattern may be positioned on a mask stage of an exposure apparatus. The exposure mask may be aligned with the substrate.

The photoresist film may react with light penetrating the exposure mask by projecting light on the exposure mask. Examples of lights that may be used in the exposure process may include an ArF light source (ArF laser) having a wavelength of 193 nm, a KrF light source (KrF laser) having a wavelength of 248 nm, an $F_2$ light source ($F_2$ laser), an Hg—Xe light source (Hg—Xe laser) or the like.

A second baking process may be performed on the photoresist film after the exposure process is performed thereon. The second baking process may be performed at a temperature of about 100° C. and about 130° C. The exposed portion may be soluble in a developing solution used in the second baking process.

Photoresist films on the exposed portion may be removed by dissolving the photoresist films using a developing solution. The developing solution may be an aqueous tetramethylammonium hydroxide (TMAH) solution.

Because an affinity of the unexposed photoresist portion for water is different from that of the exposed photoresist portion, the exposed photoresist portion may be removed by dissolving the exposed photoresist using the developing solution. A cleaning process and a drying process may be performed after the exposed photoresist is dissolved. The photoresist pattern may be a photoresist pattern for ArF including acrylate or methacrylate. The main structure of the photoresist pattern may be a simple carbon-carbon linkage.

Existence of defects of the photoresist pattern formed on the organic ARC may be determined (S130).

A photoresist pattern formed by the above-mentioned exposure method may have defects due to conditions of the exposure process and exterior variables. When the above-mentioned conditions are not satisfied, a photoresist pattern having defects may form.

When there is no defect in the photoresist pattern, a process to etch the etching object layer may be performed using the photoresist pattern as an etching mask. When there is a defect in the photoresist pattern, a reworking process of a semiconductor substrate may be performed to remove the photoresist pattern and/or to reuse the substrate and the organic ARC.

When there is a defect in the photoresist pattern, the entire surface of the photoresist pattern having the defect may be exposed to remove the photoresist pattern having the defect (S140)

Exposing the entire surface of the photoresist pattern may include exposing to light from a light source without exposure masks. Examples of light sources applied to the entire surface exposure process may include an ArF light source (ArF laser), a KrF light source (KrF laser), an $F_2$ light source ($F_2$ laser), an Hg—Xe light source (Hg—Xe laser) or the like. These may be used alone or in combinations thereof. Exposing the entire surface may induce production of an acid (H+) from the photoacid generator in the photoresist pattern having the defect.

A third baking process may be performed in to order to conduct (or perform) heat treatments on the entire-surface-exposed photoresist pattern (S150).

The third baking process may be a process for forming the entire-surface-exposed photoresist pattern (soluble to developing solution) by diffusing acids generated from inside of the entire-surface-exposed photoresist pattern. As such, the entire-surface-exposed photoresist pattern may be soluble in the developing solution used in the third baking process.

The third baking process may be performed at a temperature of about 100° C. and about 130° C. The third baking process may be performed at a temperature of about 110° C. and 120° C. The third baking process may decrease (or reduce) hardening of the photoresist pattern and simultaneously increase diffusion of acids.

The photoresist pattern having defects may be substantially removed by performing the second developing process on the photoresist pattern where the third baking process is performed (step S160).

The second developing process removes the photoresist pattern after performing the third baking process by dissolving the photoresist pattern using an aqueous TMAH solution as a developing solution. The photoresist pattern having the defects may be removed from the substrate without damage to the organic ARC by the second developing process. The reworking process on the semiconductor substrate may be conducted by performing drying and cleaning processes on the semiconductor substrate where the organic ARC is formed.

The above-mentioned reworking process on the semiconductor substrate may remove the photoresist pattern having the defects without damage to the organic ARC under the photoresist pattern by performing the entire-surface exposure and developing processes sequentially on the photoresist pattern having the defects.

FIGS. 2 to 7 are diagrams illustrating cross-sectional views of a method of forming a pattern for a semiconductor device using a method of reworking a semiconductor substrate according to example embodiments.

Figure 2:
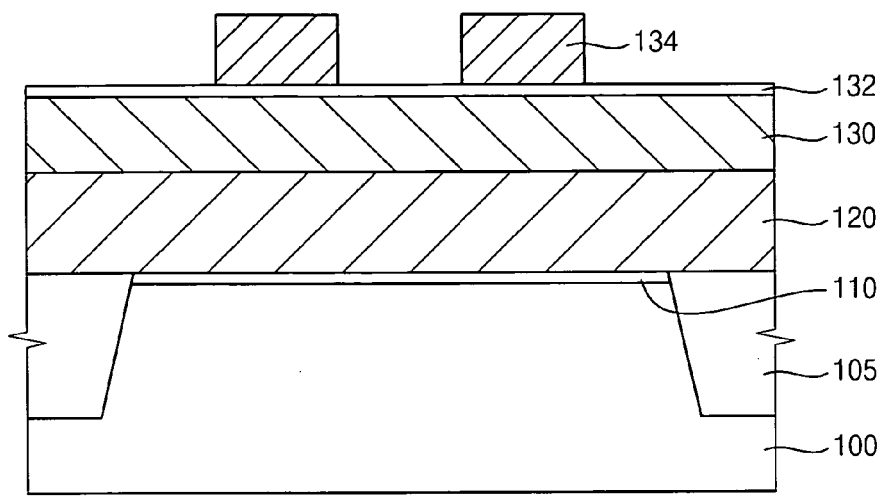

Referring to FIG. 2, a substrate 100, which has a device isolation layer 105 formed thereon by performing a device isolation process, may be prepared. The substrate 100 may be divided (or separated) into an active region and a field region by forming the isolation layer. A gate insulation layer 110, a gate electrode layer 120, a mask layer 130, an organic ARC 132 and a first photoresist pattern 134 may be formed sequentially on the substrate 100 where the isolation layer 105 is formed.

The gate insulation layer 110 may include a silicon oxide layer ($SiO_2$) or a thin film including a material having a higher dielectric constant than that of the silicon oxide layer. The material used to form the thin film of the gate insulation layer 110 may include $HfO_2$, $ZrO_2$, $Ta_2O_5$, $Y_2O_3$, $Nb_2O_5$, $Al_2O_3$, $TiO_2$, $CeO_2$, $In2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$ or similar compounds. These may be used alone or a mixture thereof.

The gate electrode layer 120 may include a polysilicon layer (not shown) doped with impurities and a conductive layer (not shown) including metals. The gate electrode layer 120 may be patterned as a gate electrode. The conductive layer may include tungsten layer (W), tungsten silicide layer (WSi), titanium nitride layer (TiN) or combinations thereof. The gate electrode layer 120 may have a stacked structure of polysilicon layer, tungsten silicide layer, titanium nitride layer, tungsten silicide layer and tungsten layer, sequentially stacked.

The mask layer 130 may be patterned into a hard mask (not shown) in a subsequent process. The mask layer 130 may be formed from a material having a highly selective etching rate to an insulating interlayer (not shown) formed in a following process. When the insulating interlayer includes oxide (e.g., silicon oxide), the mask layer may include nitride (e.g., silicon nitride). An etching object layer may include gate insulation layer 110, gate electrode layer 120 and/or mask layer 130.

The organic ARC 132 may include silicon oxynitride (SiON), silicon carbide (SiC) or the like. The organic ARC 132 may be formed on the substrate 100 to increase adhesion between the mask layer and a first photoresist pattern formed in a subsequent process. The organic ARC 132 may be formed on the substrate 100 to increase adhesion between the mask layer and a first photoresist pattern formed simultaneously to prevent (or reduce) a standing wave effect generated by interference between a light incident to a photoresist film during the formation of the first photoresist pattern and a light reflective from the mask layer.

The organic ARC 132 may be formed by spin-coating an organic material on the substrate to form preliminary organic ARC and baking the preliminary organic ARC at a temperature of about 180° C. and about 230° C.

The first photoresist pattern 134, which may be formed by a normal exposure process, may function as an etching mask for establishing a region where a gate structure is formed. The first photoresist pattern 134 may be a photoresist pattern having defects.

Figure 3:
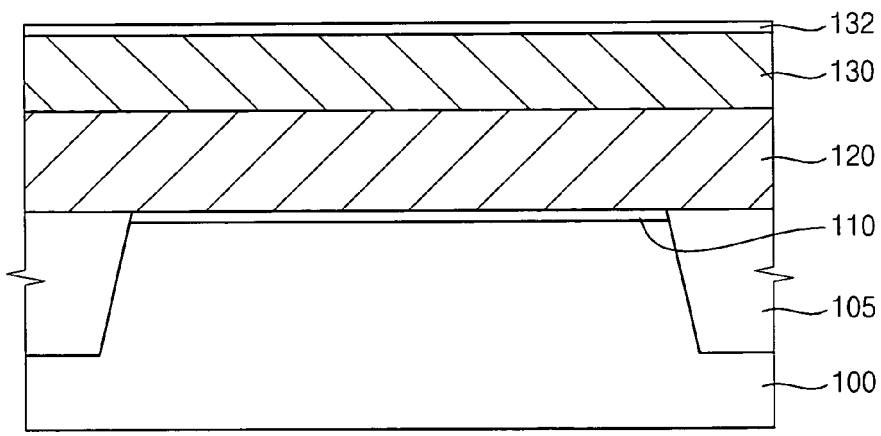

Referring to FIG. 3, a process for reworking a semiconductor substrate may be performed to remove the first photoresist pattern 134 having the defects without damage to the organic ARC 132 thereunder.

The process for reworking a semiconductor substrate to remove the first photoresist pattern having the defects will be explained in detail.

An entire surface of the first photoresist pattern 132 having the defects is exposed. The entire surface of the first photoresist pattern 132 may be exposed by exposing the photoresist pattern having the defects due to light from a light source without exposure masks.

Examples of light sources applied to the entire-surface exposure process may include an ArF light source (ArF laser), a KrF light source (KrF laser), an $F_2$ light source ($F_2$ laser), an Hg—Xe light source (Hg—Xe laser) or similar sources.

A baking process may be performed on the first photoresist pattern 132 to thermally treat the first photoresist pattern 132. The baking process may be performed at a temperature of about 100° C. and about 130° C. The baking process may be performed at a temperature of about 110° C. and about 120° C. The baking process may decrease hardening of the photoresist pattern and simultaneously increase diffusion of acids such that the first photoresist pattern is soluble in a developing solution. The baked first photoresist pattern may be removed by performing a developing process using an aqueous TMAH solution as a developing solution. As such, the first photoresist pattern having the defects may be substantially removed from the substrate without damaging the organic ARC 132 during the developing process.

Figure 4:
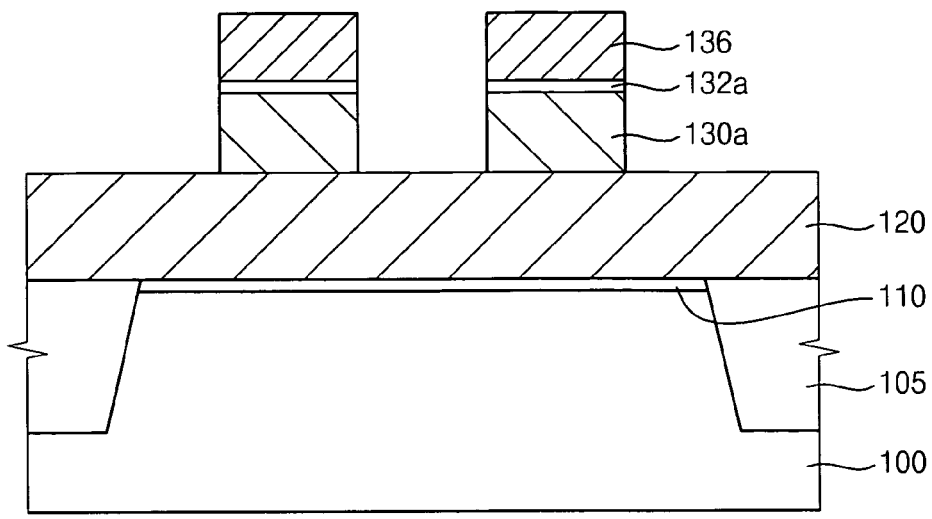

Referring to FIG. 4, a second photoresist pattern 136 may be formed on the organic ARC 132 of the semiconductor substrate 100 where the reworking process is performed. The second photoresist pattern 136 may be used as an etching mask for establishing regions of a gate structure (discussed below) on the semiconductor substrate 100.

The organic ARC 132 and mask layer 130 exposed by the second photoresist pattern 136 may be sequentially etched, forming an organic ARC pattern 132a and a hard mask 130a.

Figure 5:
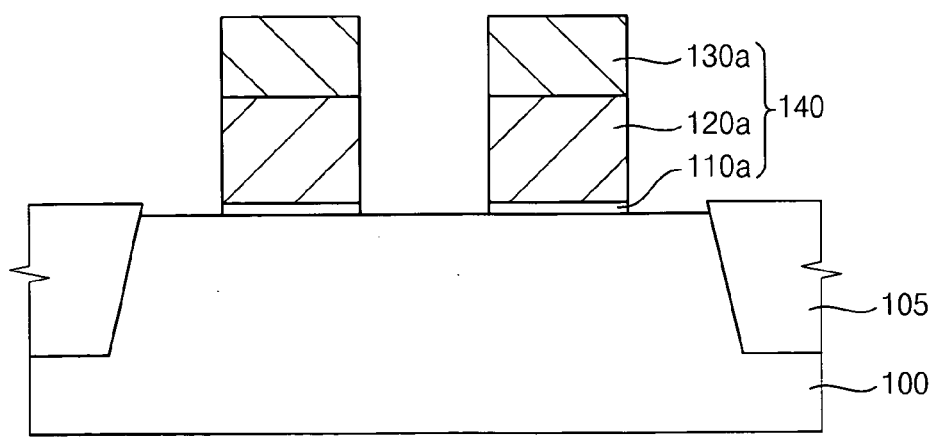

Referring to FIG. 5, the second photoresist pattern 136 and organic ARC pattern 132a may be removed by performing an oxygen plasma ashing process and a drying process.

The gate electrode layer 120 and the gate insulation layer 110 may be patterned using the hard mask as an etching mask. Examples of the patterning process may include reactive-ion etching, ion-beam etching, plasma etching, laser etching processes or similar processes. The gate electrode layer 120 may be formed into a gate electrode 120a. The gate insulation layer 110 may be formed into a gate insulation layer pattern 110a. Gate structures 140 including the gate insulation layer pattern 110a, gate electrode 120a and hard mask 130a may be formed on the substrate 100. The gate structure 140 may be an object layer pattern formed by patterning the etching object layer.

Figure 6:
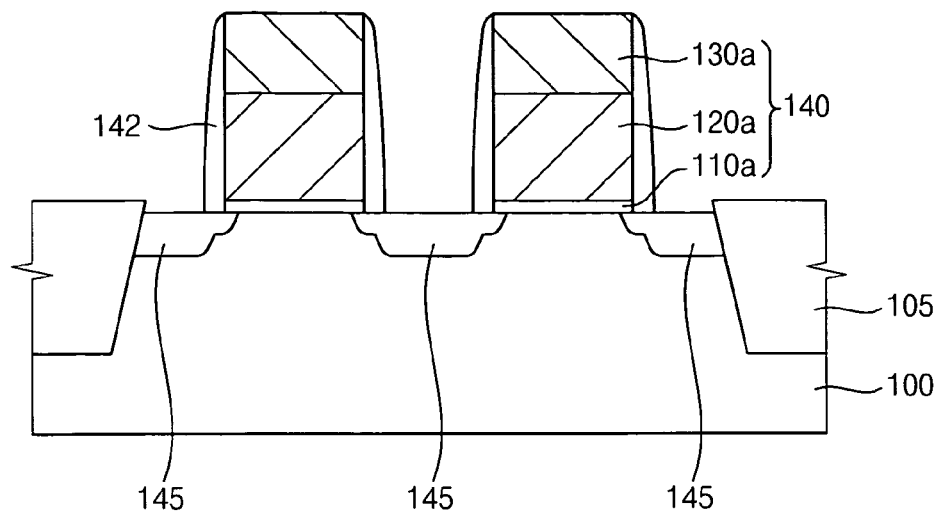

Referring to FIG. 6, impurities (not shown) may be implanted on the exposed substrate 100 between the gate structures 140 using the gate structures 140 as ion implantation masks. By performing a heat treatment process, preliminary contact regions (not shown) corresponding to preliminary source and drain regions may be formed on the substrate 100.

The preliminary source and drain regions may be formed by doping the substrate with impurities at a dose of about $1 \times 10^{11}$ to $1 \times 10^{17}$ atoms/cm$^2$. When a p-type metal-oxide semiconductor (PMOS) region and an n-type metal-oxide semiconductor (NMOS) region are positioned (or located) on the substrate 100, a second ion implantation process may be performed to form preliminary source and drain regions after forming a third photoresist pattern on the substrate 100 as ion implantation mask.

A silicon nitride layer (not shown) may be formed on the substrate 100 where the gate structures 140 are formed. Gate spacers 142 may be formed on sidewalls of the gate structures 140 by anisotropic etching the silicon nitride layer. Contact regions 145 of LDD structures may be formed by performing an ion implantation process after forming gate spacers 142. The source region in the contact regions corresponds to a capacitor contact region where a first pad is contacted. The drain region in the contact regions corresponds to a bit line contact region where a second pad is contacted. Transistors including the gate structures 140, gate spacers 142 and contact regions 145 may be formed on the substrate 100.

Figure 7:
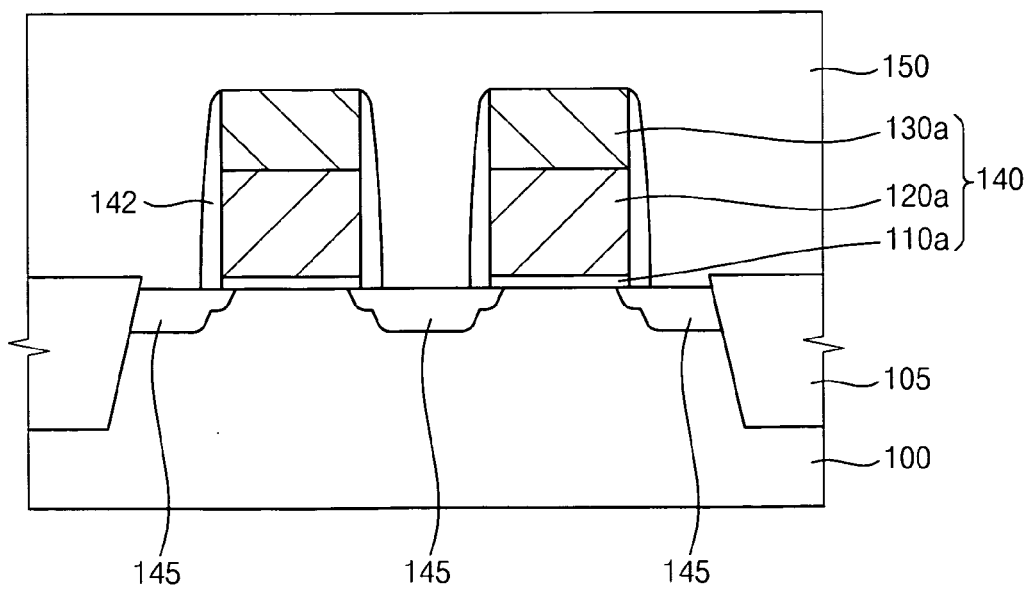

Referring to FIG. 7, an insulating interlayer 150 including an oxide may be formed on a surface of the substrate 100 to cover the gate structures 140. The insulating interlayer 150 may be formed by a chemical vapor deposition (CVD) process, a plasma-enhanced chemical vapor deposition (PECVD) process, a high density plasma chemical vapor deposition (HDP-CVD) process or an atomic layer deposition (ALD) process or the like using boron-doped phosphosilicate glass (BPSG), phosphosilicate glass (PSG), spin-on glass (SOG), plasma-enhanced tetraethylorthosilicate (PE-TEOS), undoped silicate glass (USG) or HDP-CVD oxide or similar compounds. Gate structures corresponding to patterns of semiconductor devices may have uniform profiles using the above-mentioned methods.

In above-mentioned method of reworking a semiconductor substrate according to example embodiments, a photoresist pattern having defects may be removed without damage to an organic ARC formed thereunder by sequentially performing an entire-surface exposure process and a developing process on the photoresist pattern having the defects. Because it may not necessary to perform additional processes to reform an organic ARC on the substrate when a photoresist pattern is reformed on the substrate, productivity may be increase in terms of cost and/or time.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of reworking a semiconductor substrate, the method comprising:
   forming an organic anti-reflective coating (ARC) on a substrate;
   forming a photoresist pattern on the organic ARC;
   exposing an entire surface of the substrate having the photoresist pattern when a defect occurs in the photoresist pattern; and
   removing the entire surface-exposed photoresist pattern by performing a developing process without damaging the organic ARC.

2. The method of claim 1, wherein forming the organic ARC includes forming a preliminary organic ARC by spin-coating an organic material used to form the organic ARC on the substrate; and baking the preliminary organic ARC at a temperature of about 180° C. to about 230° C.

3. The method of claim 1, wherein forming the photoresist pattern includes forming a photoresist film on the organic ARC; selectively exposing the photoresist film using an exposure mask; and developing the exposed photoresist film using a developing solution.

4. The method of claim 1, wherein the entire surface of the substrate is exposed using a light source selected from the group consisting of an ArF light source (ArF laser), a KrF light source (KrF laser), an $F_2$ light source ($F_2$ laser) and an Hg—Xe light source (Hg—Xe laser).

5. The method of claim 1, wherein the developing process is performed using a developing solution including tetramethylammonium hydroxide (TMAH).

6. The method of claim 1, further comprising baking the entire-surface-exposed photoresist pattern at a temperature of about 100° C. to about 130° C., after exposing the entire surface of the substrate.

7. The method of claim 6, wherein baking occurs at the temperature of about 110° C. to about 120° C.

8. A method of forming a pattern of a semiconductor device, the method comprising:

baking the entire-surface-exposed photoresist pattern according to claim 1 at a temperature of about 100° C. to about 130° C., prior to removing the entire surface-exposed photoresist pattern;

forming a second photoresist pattern on the organic ARC, after removing the entire surface-exposed photoresist pattern, wherein the photoresist pattern is a first photoresist pattern;

forming an object layer pattern by patterning an etching object layer using the second photoresist pattern as an etching mask, wherein the etching object layer is formed on the substrate prior to forming the organic ARC; and removing the second photoresist pattern.

9. The method of claim 8, wherein the object layer pattern includes a gate structure and a conductive wire.

10. The method of claim 8, wherein baking occurs at a temperature of about 110° C. to about 120° C.

11. The method of claim 8, wherein forming the organic ARC includes forming a preliminary organic ARC by spin-coating an organic material used to form the organic ARC on the substrate; and baking the preliminary organic ARC at a temperature of about 180° C. to about 230° C.

12. The method of claim 8, wherein forming the photoresist pattern includes forming a photoresist film on the organic ARC; selectively exposing the photoresist film using an exposure mask; and developing the exposed photoresist film using a developing solution.

13. The method of claim 8, wherein forming the second photoresist pattern includes forming a photoresist film on the organic ARC;

selectively exposing the photoresist film using an exposure mask; and developing the exposed photoresist film using a developing solution.

14. The method of claim 8, wherein the entire surface of the substrate is exposed using a light source selected from the group consisting of an ArF light source (ArF laser), a KrF light source (KrF laser), an $F_2$ light source ($F_2$ laser) and an Hg—Xe light source (Hg—Xe laser).

15. The method of claim 8, wherein the developing process is performed using a developing solution including tetramethylammonium hydroxide (TMAH).

* * * * *